US010693363B1

(12) United States Patent
White et al.

(10) Patent No.: US 10,693,363 B1
(45) Date of Patent: Jun. 23, 2020

(54) SELF CLEARING POWER MODULE

(71) Applicant: Apple Inc., Cupertino, CA (US)

(72) Inventors: Paul M. White, Sunnyvale, CA (US); Mark H. Sherwood, San Francisco, CA (US); Stephen M. Spiteri, Livermore, CA (US); Zachary M. Rubin, San Jose, CA (US)

( * ) Notice: Subject to any disclaimer, the term of this patent is extended or adjusted under 35 U.S.C. 154(b) by 274 days.

(21) Appl. No.: 15/660,627

(22) Filed: Jul. 26, 2017

Related U.S. Application Data

(60) Provisional application No. 62/373,221, filed on Aug. 10, 2016.

(51) Int. Cl.
*H03K 17/06* (2006.01)
*H02M 1/32* (2007.01)
*G01R 31/40* (2020.01)
*G01R 31/50* (2020.01)
*H02M 1/00* (2006.01)
*H02M 11/00* (2006.01)
*H02H 3/05* (2006.01)
*H02H 3/20* (2006.01)
*G11C 17/18* (2006.01)

(52) U.S. Cl.
CPC ............. *H02M 1/32* (2013.01); *G01R 31/40* (2013.01); *G01R 31/50* (2020.01); *G11C 17/18* (2013.01); *H02H 3/05* (2013.01); *H02H 3/20* (2013.01); *H02M 11/00* (2013.01); *H02M 2001/0009* (2013.01); *H03K 17/06* (2013.01)

(58) Field of Classification Search
USPC ............................. 361/18, 86–87, 93.7–93.9
See application file for complete search history.

(56) References Cited

U.S. PATENT DOCUMENTS

| 7,123,124 | B2 | 10/2006 | Caruso et al. | |
|---|---|---|---|---|
| 2002/0125892 | A1 | 9/2002 | Parker et al. | |
| 2005/0128661 | A1 | 6/2005 | Maeckel et al. | |
| 2006/0268645 | A1* | 11/2006 | Graf | H01H 37/761 365/225.7 |
| 2012/0262218 | A1* | 10/2012 | Klaka | H03K 17/06 327/383 |
| 2015/0085415 | A1* | 3/2015 | Wildner | H03K 17/08128 361/93.1 |
| 2016/0229421 | A1* | 8/2016 | Periot | B60L 3/003 |

OTHER PUBLICATIONS

Welchko et al., "Fault Interrupting Methods and Topologies for Interior PM Machine Drives," IEEE Power Electronics Letters, Dec. 2004, vol. 2, No. 4, pp. 139-143.
Cooper-Bussmann High Speed Fuses Applications Guide, 2005, 5 pages.

* cited by examiner

*Primary Examiner* — Danny Nguyen
(74) *Attorney, Agent, or Firm* — Polsinelli PC

(57) ABSTRACT

Aspects of the present disclosure involve a power module, which may include an inverter circuit employing semiconductor switch dies. In the presence of a failure of a die, which may include an arc from a short, a sensor produces a signal responsive to the failure. The signal initiates an indirect fuse, such as a pyrotechnic element, that opens conductors associated with the die. For example, the die or a related die may be wire bonded to terminals of the module. The indirect element may therefore open the bonds to the terminals to isolate the failed die and/or related dies.

18 Claims, 9 Drawing Sheets

SELF CLEARING POWER MODULE

CROSS-REFERENCE TO RELATED APPLICATIONS

This application claims the benefit under 35 U.S.C. § 119(e) of U.S. Provisional Application Ser. No. 62/373,221, filed Aug. 10, 2016, entitled "SELF CLEARING POWER MODULE," which is incorporated herein by reference in its entirety.

TECHNICAL FIELD

This disclosure relates generally to electrical power conversion systems, and more specifically to identifying a failure, such as shorted semiconductor switch die, and clearing the failure by severing conductors associated with the failed die using an indirect fuse.

BACKGROUND

Power conversion modules are used in numerous endeavors and generally involve converting alternating current to direct current (AC to DC), converting DC to AC, and may involve DC to DC conversions. An inverter is a particular type of power conversion device that is involved in converting DC energy from a battery or other power source to AC energy used by an electric motor. In such inverters and power conversion modules generally, high power semiconductor switches are used that often have a relatively shorter lifetime than other related components, and failure of such components can disable related systems, as well as damage related systems.

DETAILED DESCRIPTION

Aspects of the present disclosure involve a power module where failed dies and portions of the power module may be isolated from other parts of the power module through an indirect fusing element. In one specific example, an indirect fusing element, in the form of a pyrotechnic element, is positioned proximate bond wires, bond ribbons, or other connectors, interconnecting switch dies, and interconnecting switch dies with a DC bus or AC bus. The power module includes one more sensors that, in the presence of an arc flash, pressure wave, audible signal, and/or other consequence of a failed switch die, cause the pyrotechnic element to fire and sever the conductor or conductors to isolate the failed switch die, or a discrete portion of the power module associated with the failed switch die, from other parts of the power module or other parts of the inverter, as the case may be.

Various aspects of the present disclosure are discussed primarily with respect to an inverter power module. However, the indirect fusing arrangement and related control and sensing arrangements discussed herein may be employed in various possible power converters including, but not limited to, a DC-to-AC converter (e.g., inverter), an AC-to-DC converter, and a DC-to-DC converter, as well as any application involving a failed die or other semiconductor components that present such a failure in the form of an arc or other sensible event, and where isolating the die or related circuit elements is advantageous.

Figure 1:
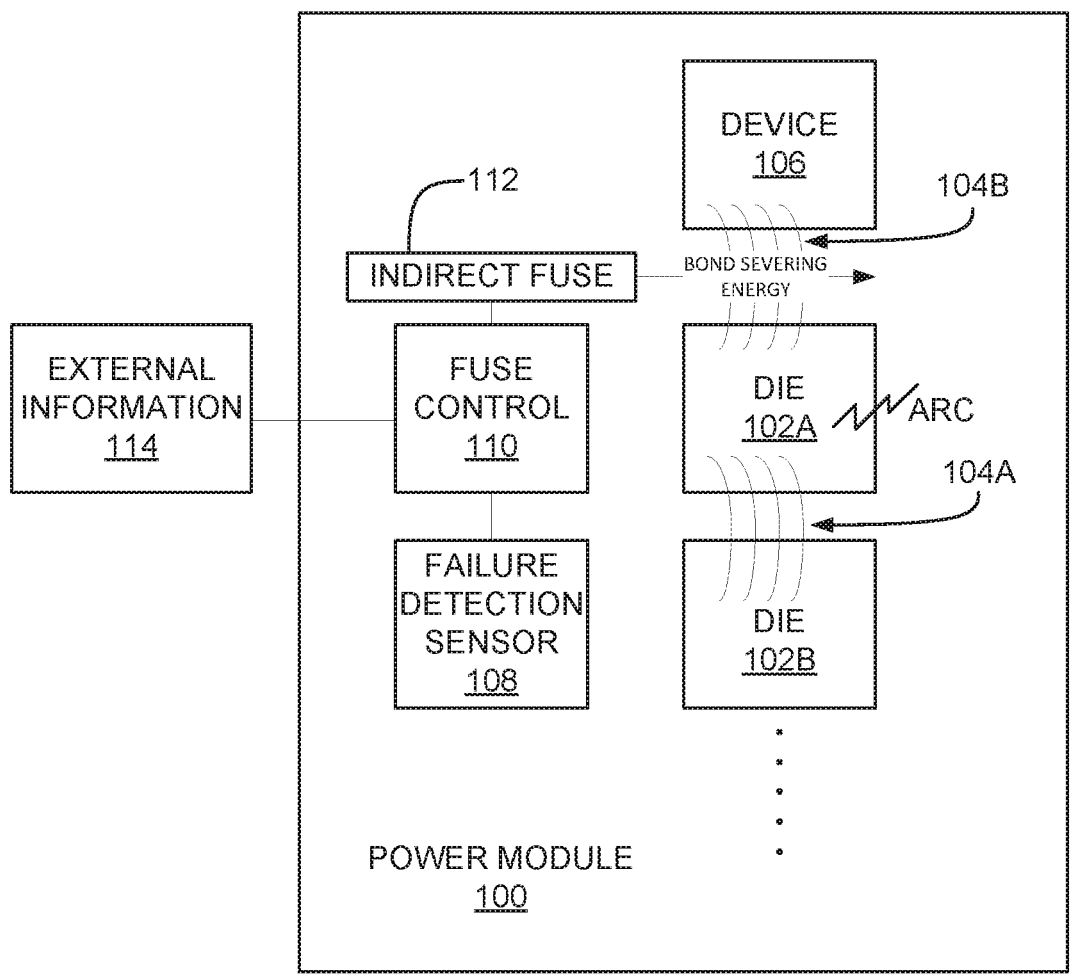
FIG. 1 is a block diagram of an example power module including an indirect fuse element positioned to disconnect a failed die, in one example embodiment.

FIG. 1 is a block diagram illustrating a power module 100 with one possible arrangement of components involved in detecting a failure of a die, which may present such a failure in the form of an arc, and then isolating the failed die from other portions of the power module through initiating an indirect fusing. Modern power modules may realize any number of possible power circuit configurations using interconnected switches to provide the desired conversion. In the example of inverters, switches may be interconnected to provide a half bridge, full bridge, H-bridge and other inverter circuit topologies. In any such topology, the switches may be transistors, thyristors, or the like. Examples of transistor switches include, for example, silicon-based transistors, wide-bandgap (WBG) transistors (e.g., those transistors employing silicon carbide (SiC), gallium nitride (GaN), and the like), or other transistors suitable for power-switching purposes. Particular types of transistors or thyristors that may be employed as the switches include, but are not limited to, metal-oxide-semiconductor field-effect transistors (MOSFETs), insulated-gate bipolar transistors (IGBTs), junction (gate) field-effect transistors (JFETs), integrated gate-commutated thyristors (IGCTs), high-electron-mobility transistors (HEMTs) (also known as modulation-doped field-effect transistors (MODFETs) or heterostructure field-effect transistors (HFETs)), metal-semiconductor field-effect transistors (MESFETs), bipolar junction transistors (BJTs), ballistic connection transistors (BCTs), gate turn-off thyristors (GTOs), and so forth, either N-type or P-type. Moreover, such transistors or thyristors may be fabricated using, for example, homoepitaxial Si, homoepitaxial SiC, homoepitaxial GaN, homoepitaxial gallium arsenide (GaAs), heteroepitaxial GaN-on-Si, heteroepitaxial GaN-on-SiC, or any other similar crystalline overlayer on a crystalline substrate combination. Also, such a transistor may or may not include body diodes, or be provided with external "anti-parallel" or "flyback" diodes to provide over-current protection to the device. The diodes may, for example, be of a P-N, junction barrier Schottky (JBS), Schottky-barrier diode (SBD), or other construction, and may include one or more materials, such as Si, SiC, GaN, GaN-on-Si, GaAs, or others.

The switches may be realized as dies 102, with the circuit topologies created through interconnecting the dies with wire bonds 104 between the dies as well as between the DC rail or AC rail as the case may be. For purposes of clarity and recognizing that aspects of the present disclosure are useful across numerous possible circuit topologies and die layouts, the power module of FIG. 1 illustrates only a first die 102A and a second die 102B interconnected by a first set of wire bonds 104A. FIG. 1 further illustrates the first die interconnected with a device 106 by a second set of wire bonds 104B. The wire bonds may be a discrete, single wire bond, more than one wire bond, a bond ribbon, or the like. The device may be another die, a terminal to an AC rail, a terminal to a DC rail or other component that the die may be connected with to form the desired circuit.

In this example, each of the switches is fabricated on a separate bare die. The dies of each switch position 102 may then be mounted (e.g., by way of soldering, sintering, and/or so on) to a substrate that may be electrically isolated from the substrates of the remaining switch positions 102 of the power module. However, other ways of organizing the dies among different substrates are also possible. The substrates may be, for example, direct bond aluminum (DBA) substrates, direct bond copper (DBC) substrates, or active-metal brazing (AMB) substrates, in some examples. The substrates may be made of aluminum oxide, aluminum oxide doped with zirconium or another material, aluminum nitride, silicon nitride, or another ceramic material. Other types of substrates may be suitable for the embodiments described herein as well.

To detect a die failure, one or more sensors 108 are positioned within the power module to detect the die failure. In many cases, a die failure may be accompanied by an arc or flash, which may further be accompanied by sound, heat, pressure, and the like. Accordingly, the sensor 108 may be any such sensor capable of detecting an arc, sound, heat, pressure or the like. Further, more than one such sensor may be employed, and sensors may further be employed to detect combinations of such failure effects.

In the specific case of arc detection, the sensor 108 may be, but is not limited to, a photo-emissive Cell, a photo-conductive-cell, a photo-voltaic cell, a photo-junction device, a light-dependent resistor, a phototransistor, or other. The arc signature detector can detect one or more spectrums of visible, ultraviolet, or infrared light, or other spectrums. The light-sensing circuit(s) and/or control circuits may be integrated into the same semiconductor substrate as the transistor(s). In some embodiments, the power module is enclosed or the dies are otherwise enclosed in a housing of some form. Accordingly, in such embodiments, there is no light normally within the power module. In such an embodiment, the presence of any light or flash, while the circuit is operable, may be treated as an arc. In other situations where some degree of light, whether ambient or otherwise, is present, characteristics (e.g., brightness, wavelength, energy, intensity, flux, radiation, and combinations thereof) of the flash relative to nominal or background light conditions may be used to identify an arc flash from other light. Similarly, a light sensor with a threshold set above nominal, may trigger an output when a flash exceeds the signal to noise ratio and the threshold. Infrared sensors may also be employed, with the presence of an infrared wavelength often being associated with heat. Given that the circuit may heat while in operation, a rapid change in the infrared wavelength, above some threshold, may be used to differentiate between normal circuit operation and a high-heat die failure.

In the specific case of heat associated with a failure, one or more sensors may be positioned to detect a rapid thermal rise, within the die(s), module, current carrying die connection(s), or assembly, that are related to the quick increase in die temperature caused by an arc or failure event, and such detection may be used, alone or in combination with the arc detection sensor, to trigger one or more indirect fuse elements. In the case of sound associated with a failure, one or more sensors may be positioned with the housing to detect a sound associated with a failure. In the case of pressure changes associated with a failure, one or more sensors may be positioned within the housing to detect a pressure increase within the housing caused by an arc or other failure event. The heat, sound, or pressure sensor may be, but is not limited to, a thermistor, a thermocouple, a resistance temperature detector (RTD), a pyrometer, a Langmuir probe, and sensors capable of using the bending or expansion rate of one or more materials, and using melting and/or boiling of one or more materials to infer a die failure. Such heat detecting sensors may be directly coupled to one or more of the die(s), module, and/or current carrying die connection(s) (e.g., wire bonds). The sensors may also be indirectly connected to the die(s) through one or more conductor(s) and/or heat pipes.

Other sensors useful alone or in conjunction with others discussed herein include vibration detection sensors, piezoelectric elements, gas or chemical detection sensors, and air particle sensors. For example, multi-axis accelerometers may be positioned proximate or in contact with a power chip or die or on a substrate supporting multiple dies, and sharp accelerations above some threshold indicative of normal vibrations may be used to suggest a failure event. A piezoelectric element may be coupled to the die or placed proximate a die, on the substrate and/or in the housing of a power module and configured to detect a failure and drive an output to the control or directly to an indirect fuse or fuses. Similarly, in the presence of a switch failure, gas or particles may be released. Since a normally operating power module, which may be partially or completely sealed, does not normally operate in the presence of gas or particle levels above some threshold, the presence of the same may indicate, alone or in conjunction with other indicators, the failure of a switch.

Additionally, the power module may measure the temperature of the dies or other parts of the inverter module via temperature sensing components or circuits mounted directly or indirectly to those dies or other parts. The temperature sensors may include, for example, thermistors, resistive temperature device (RTD) sensors, positive temperature coefficient (PTC) silistor or silicon temperature sensors, or another temperature sensor circuit. Further, the power module 100 may measure the current of one or more of the die power paths via current sensors mounted directly or indirectly to the conducting path. The current sensors may include, for example, a current mirror, a current shunt resistor, an anisotropic magneto-resistive (AMR) sensor, giant magneto-resistive (GMR) sensor, a flux gate sensor, an open-loop Hall effect sensor, a closed-loop Hall effect sensor, or another current sensor. These temperature and current sensor or circuit signals may have an electrical connection to the control circuit to provide additional information upon which to determine whether the indirect fuse should be initiated.

The sensor 108 is coupled with a controller 110 or directly with an indirect fusing element 112, as the case may be, to initiate the indirect fuse 112 in the presence of a failure. For example, if the die 102A fails as a short causing an arc, the sensor 108 will detect the arc and provide an input to the controller 110. The controller 110 may include hardware, software, or combinations thereof, to discriminate an arc induced sensor signal from other sensor signals. For example, the sensor 108 may provide an output in some range based on a normally no light or near no-light inner environment of an enclosed power module. Should the output increase above some threshold indicative of light within the module, a flash, or the like, then the controller 110 may provide an output to the indirect element 112 to activate the indirect element 112. In some cases, such as a photovoltaic cell discussed below, the sensor is directly coupled with the indirect fuse.

The controller 110 may be a hardware logic-based control circuit, such as a field-programmable gate array (FPGA) or application-specific integrated circuit (ASIC), for example. In other embodiments, the control logic circuit 110 may include one or more programmable processors, such as microprocessors, microcontrollers, and/or digital signal processors (DSPs) executing software or firmware instructions stored in a memory accessible by the processor unit. In another example, some combination of hardware logic circuitry and programmable processor may serve as the control logic.

The controller 110 may further include input and account for external information 114 related to some component related to the module. In the specific case of a vehicle, aspects of the present disclosure facilitate and provide for state-based control of the trigger threshold of the fuse, which can be based on numerous signals or external inputs that define varying modes, levels, or states from the inverter, the vehicle or other component. This allows for the fusing to vary depending on the vehicle state. The system may or may not have the ability to vary the trigger thresholds of the indirect fusing element based on modes, levels, or status received from external commands or based on knowledge from external states. Some example signals or states that might contribute to variable trigger thresholds include converter output current and voltage, converter input current, converter external shock and vibration inputs, temperature, vehicle speed and torque, and vehicle operating mode or driving state. Similarly, aspects of the present disclosure allow an inverter to be designed with minimal additional complexity, but with a self-controlled ability to remove failed components from the main traction or generating system of the vehicle before they can inflict collateral damage. For example, if parallel power modules are used to provide power to the traction motor, a failed switch in one module may be detected and the module isolated, leaving other modules to provide vehicle functionality albeit in a reduce operating state. This capability allows the inverter to continue to operate in a reduced power output/input state after a partial failure, allowing the user to schedule maintenance at their convenience, and reduces the chance for the vehicle to be completely immobilized.

Such failure robustness is especially important for vehicles with self-driving or autonomous traction capability, since these vehicles will need to control the vehicle tractive and steering effort without input from a driver. With manually-controlled vehicles, the driver can control vehicle stability via the mechanical linkage of the steering wheel to the driven vehicle axles even in the event of total loss of traction power and/or power steering. However, this is not the case when the driver is not in control of the vehicle steering, or the driver does not have a mechanical linkage to the steering system. Thus, the ability to withstand a failure and maintain the main control inputs to vehicle stability may be useful for self-driving or autonomous vehicles. The ability to vary the fusing action dependent on state is also a major improvement for self-driving or autonomous vehicles that may have different levels of self-driving autonomy that result in different vehicle operating modes.

Referring still to FIG. 1, the indirect fuse 112 is placed proximate or otherwise sufficiently close to the conductors 104B intended be severed in the presence of a die failure. For example, with a pyrotechnic indirect fuse, the pyrotechnic may be positioned such that detonation breaks the conductors but does not damage other components. The term "indirect" specifies that the element that causes the open-circuiting of a current-carrying path is not a component of the current conductor itself or in the current carrying path, like a conventional circuit breaker or fuse, but rather is a locally-placed but physically separate element that is not in the current path of the conductor. The current path is opened by severing the conductor as opposed to mechanically opening the current path with a mechanical element like a circuit breaker or opening the current path be igniting the fuse in the path. The conductor may be of various possible types including a bond wire, a bond ribbon, a trace or other such conductor printed on an insulating material, and the like. In the case of a power module, the indirect fusing element is positioned in the package so that the discharge of the element (e.g. pyrotechnic explosion) will electrically isolate the semiconductor switch from the terminals of the device. In the case of a die failing as a short circuit, the conductors are opened to avoid the unintended connection between the AC rail and the DC rail in the case of an inverter. The indirect fusing (pyrotechnic) element can be selected such that the blast is enough to electrically disconnect the die(s) from the circuit via disconnection of one or more of the main conduction path(s) of the dies, but not enough to rupture the module or cause collateral damage in the system.

The pyrotechnic fuse may be, but is not limited to, a pyrotechnic fuse blasting cap, a solid pack electric blasting cap, a match or fusehead electric blasting cap, an exploding bridgewire detonator or blasting cap, a slapper detonator or blasting cap, or a laser-initiated blasting cap. The pyrotechnic fuse can be assisted by one or more secondary explosives and/or exothermic components. The pyrotechnic fuse can open the circuit by either blast and/or heating reaction, by mechanically disconnecting, thermal melting, vaporizing, or chemically corroding the conductors.

Figure 2:
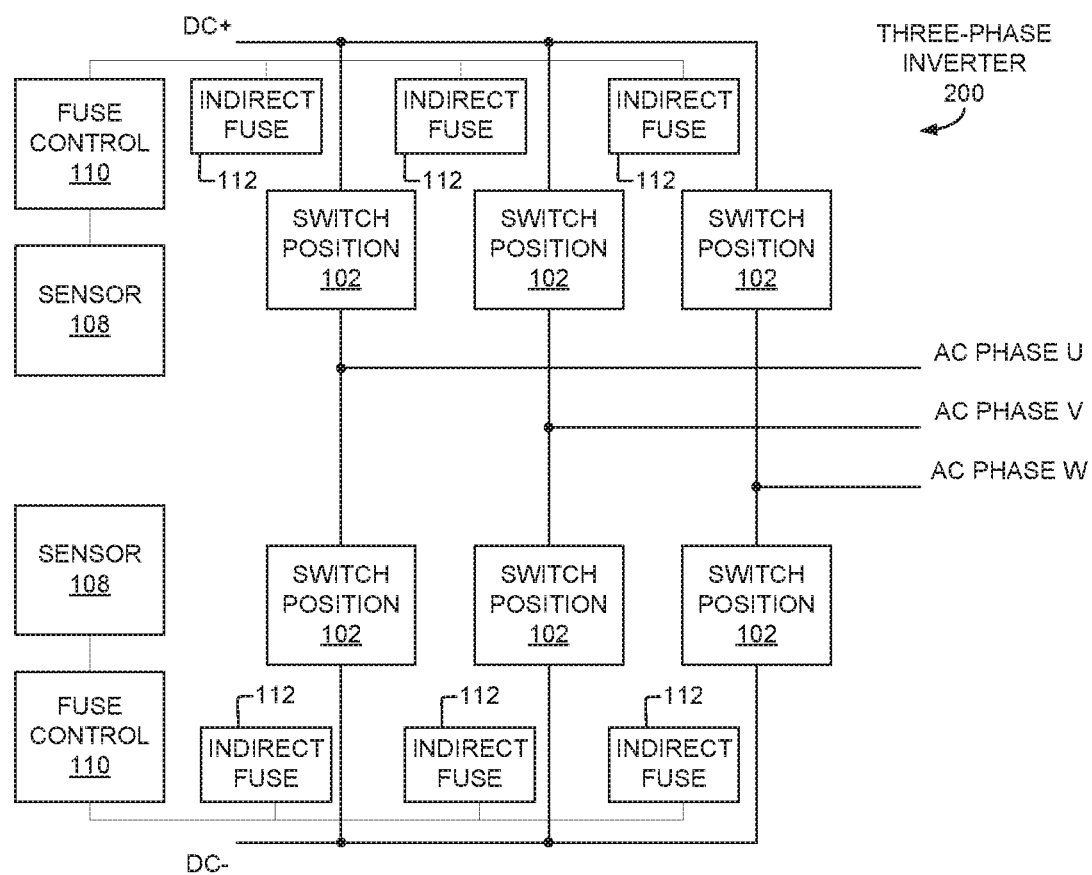
FIG. 2 is a first example three phase inverter circuit that may be deployed in a power module, the inverter circuit including indirect fuse elements to disconnect one or more switch positions in the event of a switch or other failure, in one example embodiment.

FIG. 2 is a block diagram of a three phase inverter power module circuit 200 that includes a number of switch positions 102 for taking DC input voltages as inputs and producing at least one AC voltage output. However, many other types of inverters with different numbers and configurations of switch positions may employ various aspects of the particular embodiments described herein. For example, other types of voltage-source converters other than inverters, as mentioned above, may also employ various numbers and configurations of switch positions.

More particularly, FIG. 2 is an example three-phase inverter 200 including multiple switch positions 102 in a three-phase or "six-pack" configuration. The inverter 200 receives a first DC input voltage DC+ and a second DC input voltage DC−. A switch control circuit (not illustrated in FIG. 2) may operate (e.g., open and close) the switch positions 102 according to a particular timing regime to generate a three-phase AC voltage output, with a first AC connection AC PHASE U carrying a first phase, a second AC connection AC PHASE V carrying a second phase, and a third AC connection AC PHASE W carrying a third phase. The three-phase inverter 100B may incorporate filtering and/or other conditioning circuitry to form three AC phases that are useful for driving one or more electrical loads.

The switches are connected between the DC rails (DC+ and DC−) with each switch position 102 connected either to the positive DC bus or the negative DC bus. In the case of a power module, a switch is connected with a bus using a terminal and the bus may be referred to as a DC bus bar. Similarly, the switches are connected with an AC bus bar at a terminal. The switch dies may be connected to a terminal using wire bonds. So, for example, the switches may be wire bonded to the positive or negative DC bus.

In the implementation illustrated in FIG. 2, a pyrotechnic indirect fusing element 112 is placed proximate the conductor connecting each switch position 102 to the respective DC bus. As discussed with respect to FIG. 1, one or more sensors 108 positioned within the power module, may detect a flash from an arc, sound, pressure and/or heat associated with an arc to trigger one or more of the indirect fuses 112 to isolate the failed switch.

Figure 3:
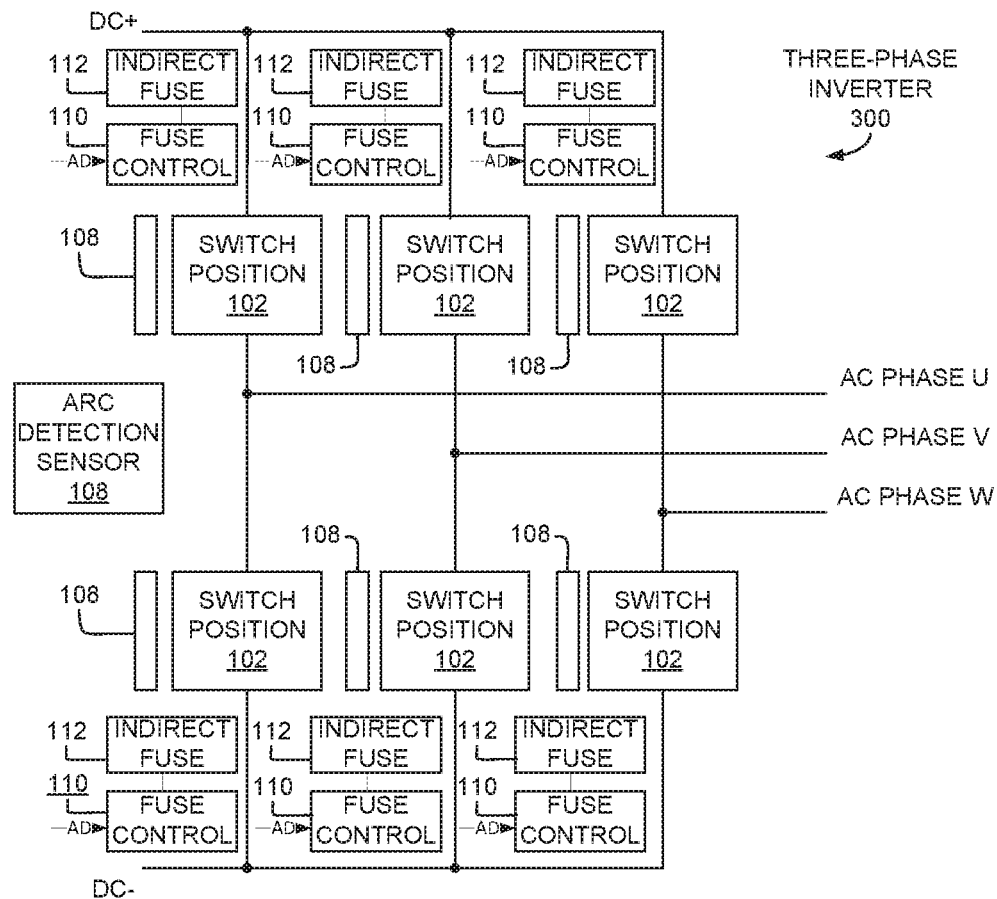
FIG. 3 is a second example three phase inverter circuit that may be deployed in a power module, the inverter circuit including indirect fuse elements to disconnect one or more switch positions in the event of a failure, in one example embodiment.

FIG. 3 is a second example three-phase inverter like shown in FIG. 2. However, in FIG. 2, a controller 110 may provide signals to more than one indirect fuse 112 to activate the fuses. In FIG. 3, each fuse 112 has a separate control 110. Other similar alternatives are possible depending on the implementation.

Figure 4A:
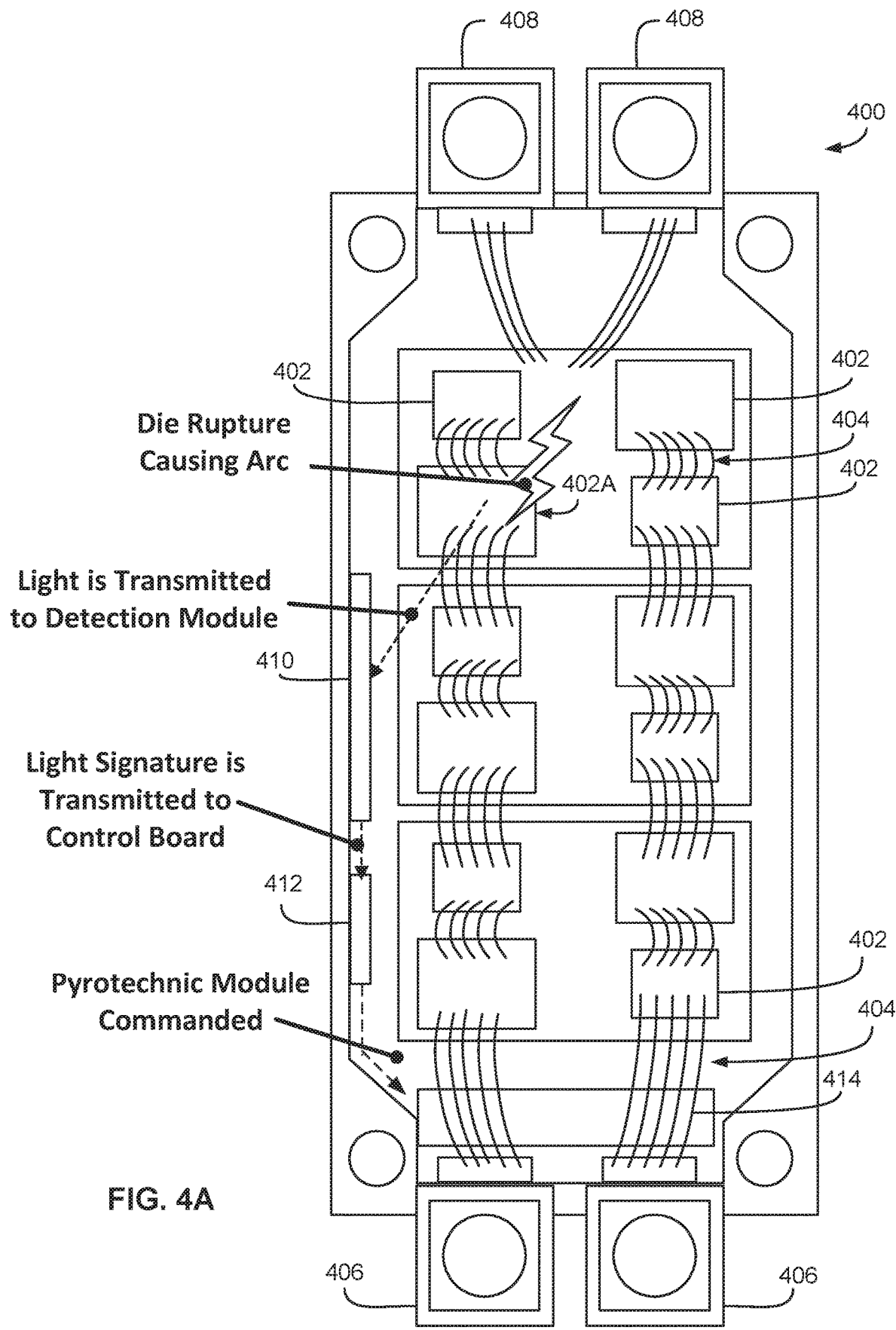
FIG. 4A is an example of a power module including several switch dies implementing an inverter, the diagram illustrating an arc from one of the dies and initiation of a pyrotechnic indirect fuse element to disconnect the power module from a DC bus bar, in one example embodiment.
Figure 4B:
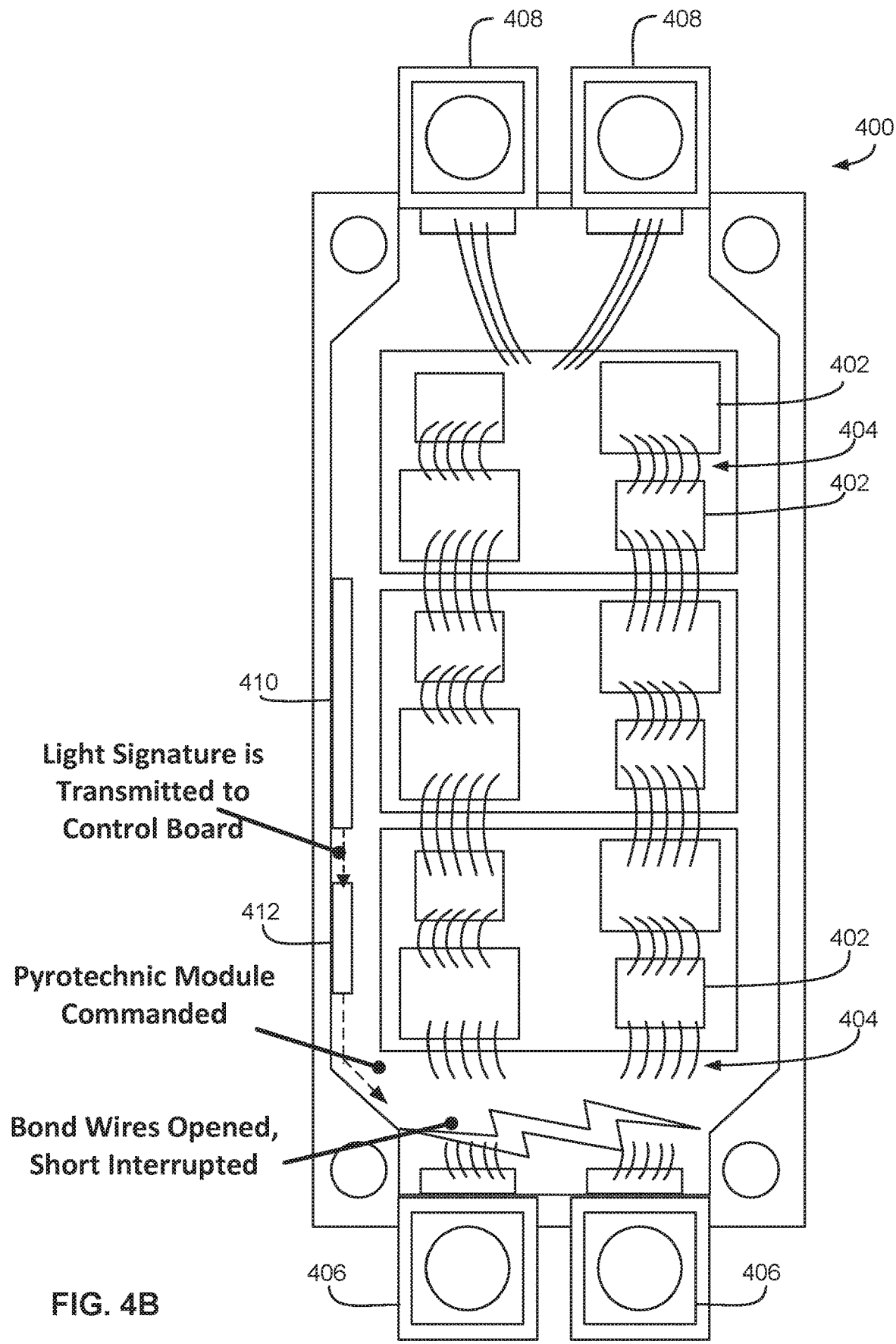
FIG. 4B is the example of the power module of FIG. 4A, illustrating the result of a blast from the pyrotechnic indirect fuse element with the blast severing bond wires connecting the circuit realized in the power module from terminals connecting the circuit to the DC bus, in one example embodiment.

FIGS. 4A and 4B illustrate examples of a power module 400 having a collection of dies 402 to provide an inverter. As shown, the dies 402 are interconnected with wire bonds 404. The switch dies 402 are connected with DC terminal 406 and AC terminals 408 also at wire bonds 404. The terminals may be connected with respective DC and AC bus bars (not shown). The power module 400 further includes a sensor 410 coupled with a controller 412. FIG. 4A illustrates a failure in die 402A causing an arc. FIG. 4B illustrates the result of an indirect fuse 414 (see FIG. 4A) opening the conductive path to isolate the shorted die, and the module from the DC bus by disconnecting the bond wires connected to DC terminals 406. The indirect fuse 414 is in the form of a pyrotechnic device positioned under the bond wires 404 connecting the circuit to the DC bus terminals 406. In some possible implementations, the power module 400 illustrated in FIGS. 4A and 4B may be coupled in parallel to provide parallel switches at each switch position. In such an embodiment, the other power modules may maintain operation when the power module 400 is isolated from the DC bus.

Figure 5:
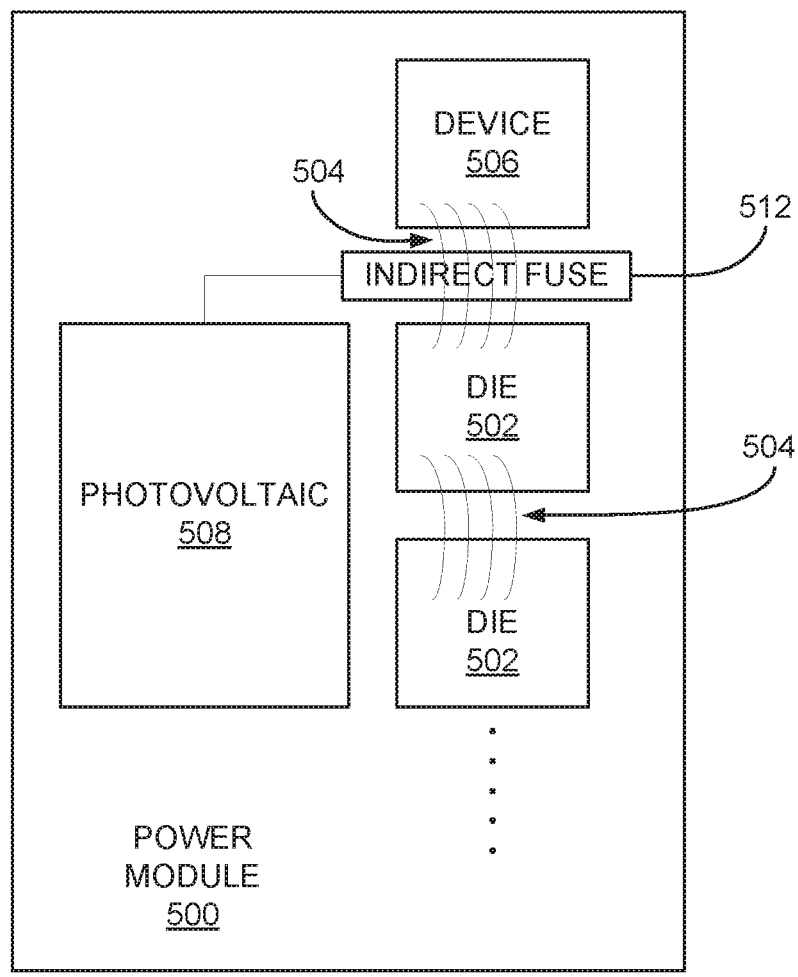
FIG. 5 is a block diagram illustrating a power module with a photovoltaic cell directly initiating an indirect fuse positioned under bond wires between a die and a device such as a terminal, in one example embodiment.

FIG. 5 is an example of a power module 500 implementing any of a variety of possible power circuits including an inverter. The power module 500 includes semiconductor switch dies 502 mounted on a substrate. As with other diagrams, only two die are shown but other die may be present. The dies are wire bonded 504 to each other, and may further be wire bonded to other devices including a terminal. To sense a failure, a photovoltaic cell (or cells) 508 are positioned within the module housing and may be positioned proximate the die. Photovoltaic cells may further be placed proximate each die, generally within the module and in a position to receive sufficient light from an arc event. Stated differently, one or more photo-voltaic cells may be connected in series and/or parallel combinations to create a voltage and/or current source when a light source is present. The cells are mounted on a printed circuit board or otherwise operatively arranged within the module. The module, which may be sealed, does not allow in outside light. Hence, the solar cells only become active and produce voltage when a light source taking the form of an arc caused by semiconductor and/or semiconductor interconnection failure is present. In this embodiment, the output of the cell (or cells) may directly drive an indirect fuse element 512. Moreover, the cell output may provide sufficient energy to the pyrotechnic fuse 512 for initiation of the same. In any embodiment, it is also possible that a controller will provide sufficient energy to initiate the indirect fuse element 512. Accordingly, the cells may provide an output to a controller (not shown in FIG. 5) to initiate the indirect fuse 512, alone or in conjunction with other inputs from vehicle systems and/or other sensors.

The solar cell may include amorphous silicon solar cell, biohybrid solar cell, cadmium telluride photovoltaic cell, copper indium gallium selenide solar cells, crystalline silicon solar cell, dye-sensitized solar cell, gallium arsenide germanium solar cell, micromorph solar cell, monocrystalline solar cell, multi-junction solar cell, nanocrystal solar cell, organic solar cell, perovskite solar cell, plasmonic solar cells, organic solar cell, polycrystalline solar cell, polymer solar cell, quantum dot solar cell, thin-film solar cell, or other solar cell, or a combination of any of the aforementioned types. Such cells may be integrated in the same substrate as the transistors.

Figure 6:
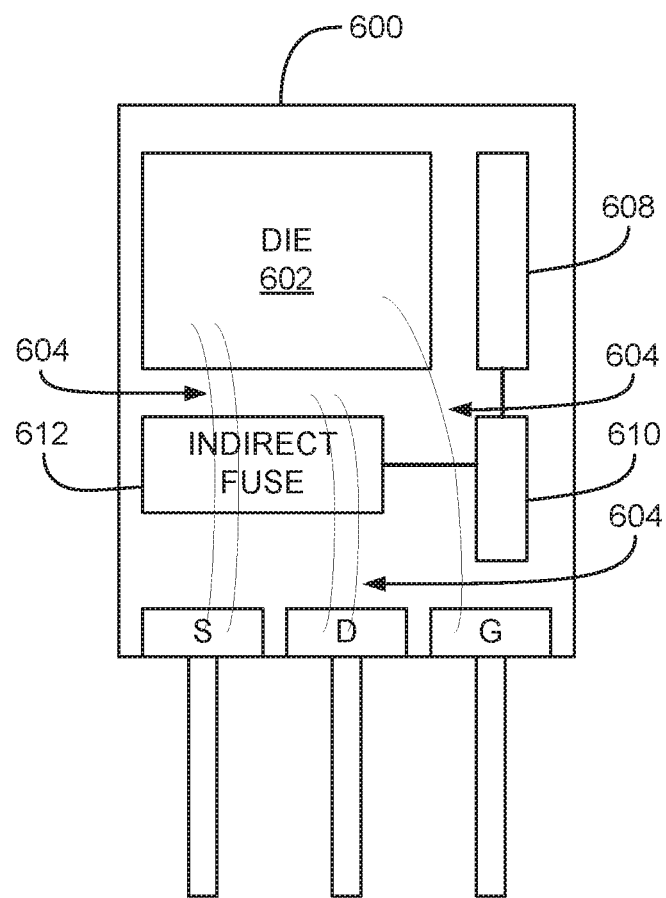
FIG. 6 is a diagram of a discrete transistor switch package including an integrated indirect fuse element, sensor and control circuitry for initiating the indirect fuse in the presence of a die failure, in one example embodiment.

FIG. 6 illustrates a discrete power transistor package 600 with an integrated sensor 608, control 610 and indirect fuse element 612. The drain (D), source (S) and gate (G) pins are wire bonded 604 to corresponding regions of the transistor. The indirect fuse 612 is mounted on a substrate between the die 602 and the pins such that it is adjacent to the wire bonds 604 interconnecting the die 602 to the pins. The sensor 608 is mounted on the substrate, as well, and positioned to detect a failure of the die 602. Upon such detection, the sensor 608 provides a signal to the controller 610, also mounted on the substrate or otherwise provided in the package, which initiates the indirect fuse 612, which initiation may be causing detonation of a pyrotechnic element. The controller 610, like other control functionality discussed herein, may include various operations to discriminate between an actual failure event (like an arc) and false events, as well as take into account state information and account for multiple sensor inputs.

In some situations one or more switches may be connected in parallel. For example, at each switch position of an inverter, more than one switch may be connected in parallel. In such cases, dies may also be mounted in parallel on a substrate. In such situations, the indirect fusing element may be positioned to sever the drain connections, the gate and source connections, the gate and drain connections, or the gate, drain and source connections. Hence, it may not be required to sever all connections of the switch.

The power module may also include a current sensor card with processing capability to identify high frequency signatures in the output current that would be characteristics of an arc. In the case that an arc is measured, the control circuitry will engage the pyrotechnic fuse, and open the connections to the module. Such a current sensor may be used solely to identify a failure or may be used in conjunction with other detection methods discussed herein to verify or confirm a failure, which may assist in reducing false positives or trips. The current sensor can be replaced with a voltage sensor for the same effect.

Figure 7:
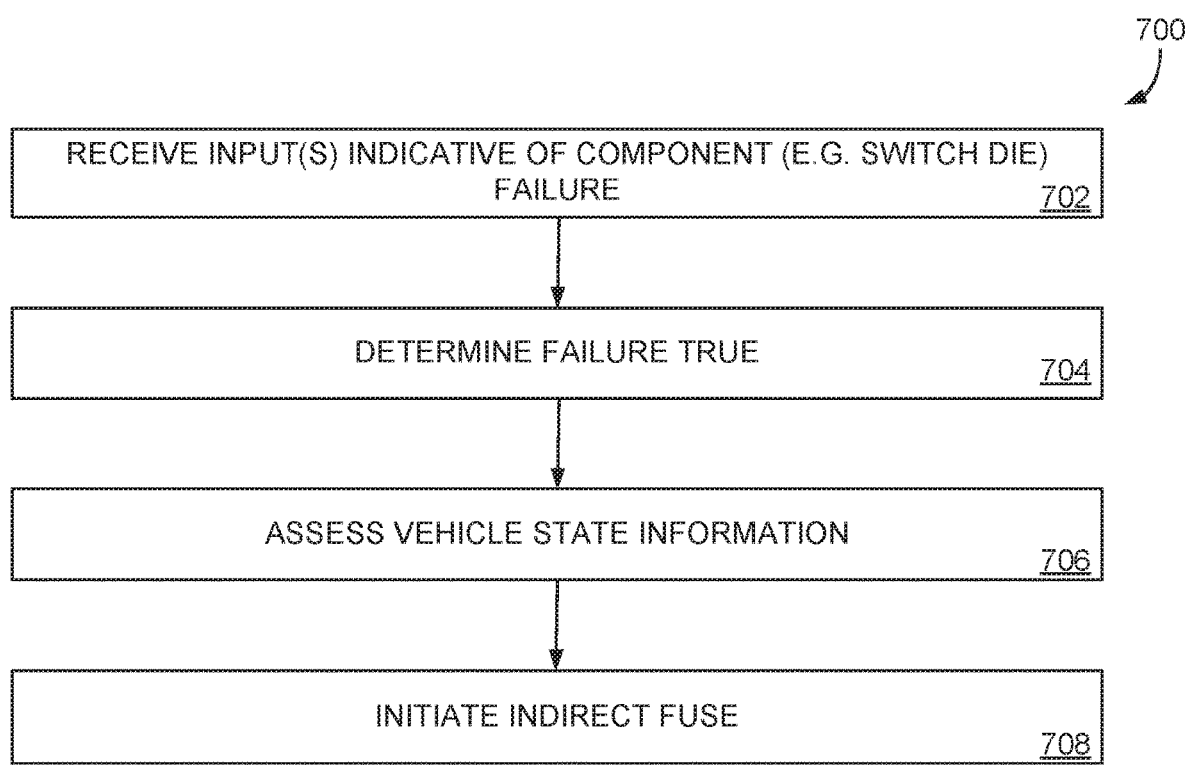
FIG. 7 is a flow diagram illustrating one possible method of initiating an indirect fuse based on a sensed die failure.

FIG. 7 is a flow diagram of an example method 700 of detecting a failure and isolating a failed component. To begin, a sensor generates an output indicative of a failed switch die (operation 702). For example, an optical sensor may produce a signal indicative of a frequency spectrum of light associated with an arc. In another example, a pressure sensor may produce a signal indicative of a pressure change associated with an arc. The signal or signals as the case may be are provided to a controller.

The controller or other device then may determine whether the signal is indicative of a failure (operation 704). For example, the controller may include functionality to compare the sensor signal to a threshold. The controller may also include functionality to compare more than one type of sensor signal to different thresholds. The controller may determine that a failure has occurred if one threshold is met, both thresholds are met or other combinations. The controller may also be configured to account for other inputs. For example, the controller may receive vehicle state information (operation 706). If the vehicle or the module is not operating, for example, and an event is sensed indicative of a failure but no such event is possible as the inverter is not operating, the controller may determine that the signal is false and not initiate the indirect fuse.

When a switch fails, the system initiates an indirect fuse element (operation 708). The indirect fuse element isolates the switch or otherwise disconnects the switch. The indirect fuse element may be positioned anywhere and in relation to any conductor that can achieve the desired isolation or disconnection effect. For example, a single fuse may be positioned to sever the connection of an inverter to the AC Bus or the DC bus. In such an example, severing the connection will isolate the failed switch as well as the other switches. It is also possible to arrange indirect fuses adjacent individual elements intended to be isolated or disconnected. In the case of an inverter circuit, a failed switch die may cause the entire circuit to become inoperative and thus disconnecting the entire circuit achieves the same effect as isolating a discrete switch.

While FIG. 7 depicts the operations of the method 700 as being performed in a single particular order, the operations may be performed simultaneously or concurrently, as well as continuously and/or repetitively over some period of time. Similarly, more or less operations may be involved depending on any given implementation.

Figure 8:
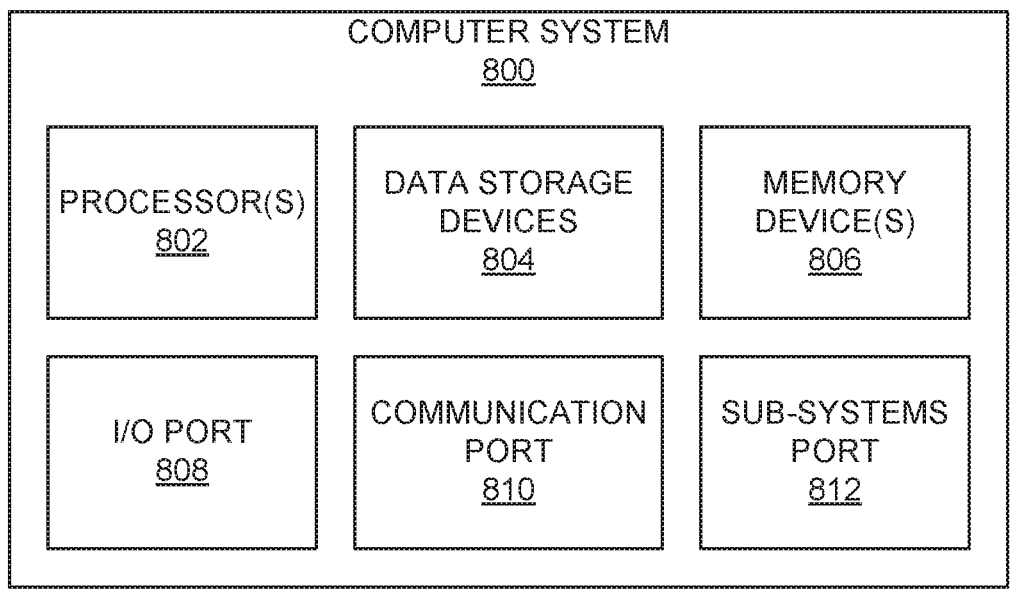
FIG. 8 is an example computing system that may implement various controls and methods of the presently disclosed technology.

Referring to FIG. 8, a detailed description of an example computing system 800 having one or more computing units that may implement various systems and methods discussed herein is provided. The computing system 800 may be part of a power module, may be a part of a traction motor, and may be part of an overall vehicle system. The computing system 800 may process various signals discussed herein and/or may provide various signals discussed herein. For example, vehicle state information may be provided by such a computing system 800 to a controller. The computing system 800 may also be applicable to, for example, the controller discussed with respect to FIGS. 1-3 and others, and may be used to implement the method of FIG. 7. It will be appreciated that specific implementations of these devices may be of differing possible specific computing architectures, not all of which are specifically discussed herein but will be understood by those of ordinary skill in the art.

The computer system 800 may be a computing system that is capable of executing a computer program product to execute a computer process. Data and program files may be input to the computer system 800, which reads the files and executes the programs therein. Some of the elements of the computer system 800 are shown in FIG. 8, including one or more hardware processors 802, one or more data storage devices 804, one or more memory devices 806, and/or one or more ports 808-812. Additionally, other elements that will be recognized by those skilled in the art may be included in the computing system 800 but are not explicitly depicted in FIG. 8 or discussed further herein. Various elements of the computer system 800 may communicate with one another by way of one or more communication buses, point-to-point communication paths, or other communication means not explicitly depicted in FIG. 8.

The processor 802 may include, for example, a central processing unit (CPU), a microprocessor, a microcontroller, a digital signal processor (DSP), and/or one or more internal levels of cache. There may be one or more processors 802, such that the processor 802 comprises a single central-processing unit, or a plurality of processing units capable of executing instructions and performing operations in parallel with each other, commonly referred to as a parallel processing environment.

The computer system 800 may be a conventional computer, a distributed computer, or any other type of computer, such as one or more external computers made available via a cloud computing architecture. The presently described technology is optionally implemented in software stored on the data stored device(s) 804, stored on the memory device(s) 806, and/or communicated via one or more of the ports 808-812, thereby transforming the computer system 800 in FIG. 8 to a special purpose machine for implementing the operations described herein. Examples of the computer system 800 include personal computers, terminals, workstations, mobile phones, tablets, laptops, personal computers, multimedia consoles, gaming consoles, set top boxes, embedded computing and processing systems, and the like.

The one or more data storage devices 804 may include any non-volatile data storage device capable of storing data generated or employed within the computing system 800, such as computer executable instructions for performing a computer process, which may include instructions of both application programs and an operating system (OS) that manages the various components of the computing system 800. The data storage devices 804 may include, without limitation, magnetic disk drives, optical disk drives, solid state drives (SSDs), flash drives, and the like. The data storage devices 804 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 806 may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 804 and/or the memory devices 806, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 800 includes one or more ports, such as an input/output (I/O) port 808, a communication port 810, and a sub-systems port 812, for communicating with other computing, network, or vehicle devices. It will be appreciated that the ports 808-812 may be combined or separate and that more or fewer ports may be included in the computer system 800.

The I/O port 808 may be connected to an I/O device, or other device, by which information is input to or output from the computing system 800. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 800 via the I/O port 808. Similarly, the output devices may convert electrical signals received from computing system 800 via the I/O port 808 into signals that may be sensed as output by a human, such as sound, light, and/or touch. The input device may be an alphanumeric input device, including alphanumeric and other keys for communicating information and/or command selections to the processor 802 via the I/O port 808. The input device may be another type of user input device including, but not limited to: direction and selection control devices, such as a mouse, a trackball, cursor direction keys, a joystick, and/or a wheel; one or more sensors, such as a camera, a microphone, a positional sensor, an orientation sensor, a gravitational sensor, an inertial sensor, and/or an accelerometer; and/or a touch-sensitive display screen ("touchscreen"). The output devices may include, without limitation, a display, a touchscreen, a speaker, a tactile and/or haptic output device, and/or the like. In some implementations, the input device and the output device may be the same device, for example, in the case of a touchscreen.

The environment transducer devices convert one form of energy or signal into another for input into or output from the computing system 800 via the I/O port 808. For example, an electrical signal generated within the computing system 800 may be converted to another type of signal, and/or vice-versa. In one implementation, the environment transducer devices sense characteristics or aspects of an environment local to or remote from the computing device 800, such as, light, sound, temperature, pressure, magnetic field, electric field, chemical properties, physical movement, orientation, acceleration, gravity, and/or the like. Further, the environment transducer devices may generate signals to impose some effect on the environment either local to or remote from the example computing device 800, such as, physical movement of some object (e.g., a mechanical actuator), heating or cooling of a substance, adding a chemical substance, and/or the like.

In one implementation, a communication port 810 is connected to a network by way of which the computer system 800 may receive network data useful in executing the methods and systems set out herein as well as transmitting information and network configuration changes determined thereby. Stated differently, the communication port 810 connects the computer system 800 to one or more communication interface devices configured to transmit and/or receive information between the computing system 800 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 810 to communicate with one or more other machines, either directly over a point-to-point communication path, over a wide area network (WAN) (e.g., the Internet), over a local area network (LAN), over a cellular (e.g., third generation (3G) or fourth generation (4G)) network, or over another communication means. Further, the communication port 810 may communicate with an antenna for electromagnetic signal transmission and/or reception. In some examples, an antenna may be employed to receive Global Positioning System (GPS) data to facilitate determination of a location of a machine, vehicle, or another device.

The computer system 800 may include a sub-systems port 812 for communicating with one or more systems related to a vehicle to control an operation of the vehicle and/or exchange information between the computer system 800 and one or more sub-systems of the vehicle. Examples of such sub-systems of a vehicle, include, without limitation, imaging systems, radar, lidar, motor controllers and systems, battery control, fuel cell or other energy storage systems or controls in the case of such vehicles with hybrid or electric motor systems, autonomous or semi-autonomous processors and controllers, steering systems, brake systems, light systems, navigation systems, environment controls, entertainment systems, and the like.

In an example implementation, inverter and/or motor information and software and other modules and services may be embodied by instructions stored on the data storage devices 804 and/or the memory devices 806 and executed by the processor 802. The computer system 800 may be integrated with or otherwise form part of a vehicle. In some instances, the computer system 800 is a portable device that may be in communication and working in conjunction with various systems or sub-systems of a vehicle.

The system set forth in FIG. 8 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium, optical storage medium; magneto-optical storage medium, read only memory (ROM); erasable programmable memory (e.g., EPROM and EEPROM); flash memory; or other types of medium suitable for storing electronic instructions.

While the present disclosure has been described with reference to various implementations, it will be understood that these implementations are illustrative and that the scope of the disclosure is not so limited. Many variations, modifications, additions, and improvements are possible. More generally, implementations in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. An apparatus comprising:
a housing including a semiconductor die and a conductor electrically coupled with the semiconductor die;
a sensor positioned within the housing;
an indirect fuse element positioned proximate the conductor;
wherein the sensor is configured to detect an indication of a failure of the semiconductor die;
wherein the indirect fuse element is configured to sever the conductor responsive to a signal, based on the detected indication, indicative of a failure of the semiconductor die;
a controller operatively coupled with the sensor and the indirect fuse element, wherein the controller is configured to:
receive the detected indication from the sensor;
determine whether the detected indication represents the failure of the semiconductor die; and
in accordance with the determination that the detected indication represents a failure of the semiconductor die, send the signal to the indirect fuse element.

2. The apparatus of claim 1, wherein the conductor is a bond wire, a bond ribbon or a conductor printed on an insulating material.

3. The apparatus of claim 1 further comprising:
a second sensor positioned within the housing, the second sensor is configured to detect a second indication of a failure of the semiconductor die, the second indication different from the indication; and
the controller operably coupled with the sensor and the second sensor, the controller further coupled with the indirect fuse element; wherein the controller is configured to:
receive the detected indication from the sensor and the detected second indication from the second sensor;
determine whether the detected indication represents the failure of the semiconductor die;
determine whether the detected second indication represents the failure of the semiconductor die; and
in accordance with the determination that the detected indication represents the failure of the semiconductor die and the determination that the second detected indication represents the failure of the semiconductor die, send the signal to the indirect fuse element.

4. The apparatus of claim 1 wherein the sensor is a solar cell, the solar cell positioned in relation to the semiconductor die to detect an arc flash from the semiconductor die indicative of the failure of the semiconductor die, the solar cell providing the signal and power to engage the indirect fusing element.

5. The apparatus of claim 1 wherein the sensor is at least one of an optical sensor, a pressure sensor, and a temperature sensor.

6. A method of mitigating a semiconductor die failure in a power module comprising:
during operation of a power circuit having a semiconductor component, receiving a sensor signal indicative of a failure of a semiconductor component;
based on the sensor signal, initiating a pyrotechnic charge to sever a circuit path to interrupt a current flow through the failed semiconductor component; and
wherein the power circuit is an inverter circuit, the semiconductor component is a die for a switch position of the inverter circuit, and the sensor signal is indicative of an arc generated from the failure of the semiconductor component.

7. The method of claim 6 further comprising:
receiving a second sensor signal, different from the sensor signal, the second sensor signal indicative of the failure of the semiconductor component; and
based on the sensor signal and the second sensor signal, initiating the pyrotechnic charge to open the circuit path to isolate the failed semiconductor component.

8. The method of claim 6 further comprising:
receiving a signal indicative of a state of a component related to the power circuit; and
based on the sensor signal and the signal indicative of the state of the component, initiating the pyrotechnic charge to sever the circuit path to interrupt a current flow through the failed semiconductor component.

9. The method of claim 8 wherein the semiconductor component is part of an inverter providing power to a motor, the method further comprising:
based on the sensor signal and the signal indicative of the component, initiating the pyrotechnic charge to open the circuit path to isolate the failed semiconductor component while maintaining operation of the inverter to provide power to the motor.

10. An apparatus comprising:
an inverter in an enclosed housing, the inverter comprising a plurality of switch die positions arranged as an inverter, the switch die positions interconnected between an AC bus and a DC bus, the AC bus providing power to an electric component, the inverter further including a pyrotechnic element positioned proximate a conductor and not in a current path of the conductor, the conductor coupling the inverter to at least one of the AC bus or the DC bus, the inverter further including a sensor positioned within the enclosed housing, the sensor producing an output in the presence of an arc flash from one of the switch die positions, the output triggering the pyrotechnic element to sever the conductor.

11. The apparatus of claim 10, wherein the conductor is a bond wire, a bond ribbon or a conductor printed on an insulating material.

12. The apparatus of claim 10 further comprising a controller operatively coupled with the sensor and the indirect fuse element, the controller configured to:
  receive the output produced in the presence of the arc flash;
  generate, when it is determined that the arc flesh represents a failure of one of the die positions, an output to the pyrotechnic element to sever the conductor.

13. The apparatus of claim 12, wherein the controller receives a signal indicative of a state of a component operatively related to the inverter, the controller to initiate the pyrotechnic element based on the output produced in the presence of the arc flash and the signal indicative of the state of the component.

14. The apparatus of claim 10 further comprising:
  a second sensor positioned within the enclosed housing, the second sensor to provide a second output in the presence of the arc flash from one of the switch die positions, the second output different from the output from the sensor; and
  a controller operably coupled with the sensor and the second sensor, the controller further coupled with the pyrotechnic element, the controller configured to:
  receive the output and the second output; and
  initiate, when it is determined that the arc flash represent a failure of the one of the die positions and the second output confirms the determination, the pyrotechnic element to sever the conductor.

15. The apparatus of claim 10 wherein the sensor is a solar cell, the solar cell positioned within the enclosed housing to detect the arc flash, the solar cell providing the output.

16. The apparatus of claim 10 wherein the sensor is at least one of an optical sensor, a pressure sensor, or a temperature sensor.

17. The apparatus of claim 10 further comprising a second inverter comprising a plurality of second switch die positions in parallel with the plurality of switch die positions of the inverter, the second switch die positions interconnected between the AC bus and the DC bus, the second inverter further including a second pyrotechnic element positioned proximate a second conductor coupled with the AC bus or the DC bus, the second inverter further including a second sensor to produce a second output in the presence of a second arc flash from one of the second switch die positions; and wherein when the sensor produces the output in the presence of an arc flash from one of the switch die positions, the output triggering the pyrotechnic element to open the conductor, the second inverter maintains operation while the inverter no longer provides power to the AC bus.

18. The apparatus of claim 10 wherein the sensor is a solar cell, the solar cell positioned to detect an arc flash from a semiconductor die of one of the plurality of switch die positions, the art flash indicative of the failure of the semiconductor die, the solar cell providing the signal and power to trigger the pyrotechnic element to sever the conductor.

* * * * *